(12) United States Patent
Onishi et al.

(10) Patent No.: US 7,391,798 B2
(45) Date of Patent: Jun. 24, 2008

(54) SEMICONDUCTOR LASER DEVICE

(75) Inventors: Toshikazu Onishi, Kyoto (JP);
Kazutoshi Onozawa, Osaka (JP);
Tetsuzo Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 113 days.

(21) Appl. No.: 11/410,048

(22) Filed: Apr. 25, 2006

(65) Prior Publication Data

US 2006/0245459 A1    Nov. 2, 2006

(30) Foreign Application Priority Data

Apr. 27, 2005  (JP) ............................. 2005-129300

(51) Int. Cl.
*H01S 5/00* (2006.01)
(52) U.S. Cl. ................. 372/46.01; 372/43.01; 372/45.01

(58) Field of Classification Search ............. 372/43.01, 372/45.01, 46.01
See application file for complete search history.

(56) References Cited

U.S. PATENT DOCUMENTS

| 5,963,568 A | * | 10/1999 | Paoli | ............................ 372/23 |
| 2005/0058169 A1 | * | 3/2005 | Onishi | ........................ 372/44 |

FOREIGN PATENT DOCUMENTS

| JP | 05-218582 | 8/1993 |
| JP | 2003-017813 | 1/2003 |
| JP | 2003-188471 | 7/2003 |
| JP | 2003-324250 | 11/2003 |
| JP | 2004-088054 | 3/2004 |

* cited by examiner

*Primary Examiner*—Dung T Nguyen
(74) *Attorney, Agent, or Firm*—McDermott Will & Emery LLP (57) ABSTRACT

A semiconductor laser device includes: an active layer formed on a substrate and including an AlGaAs layer; and an upper spacer layer formed at least one of above and below the active layer and including $Al_aGa_bIn_{1-a-b}P$ (where $0 \leq a \leq 1$, $0 \leq b \leq 1$, and $0 \leq a+b \leq 1$). The upper spacer layer has a composition enough to serve as a barrier layer against electrons injected into the active layer.

12 Claims, 6 Drawing Sheets

SEMICONDUCTOR LASER DEVICE

BACKGROUND OF THE INVENTION

Field of the Invention

The present invention relates to semiconductor laser devices used as light sources for, for example, optical recording and optical communication, and particularly relates to surface emitting semiconductor laser devices.

In recent years, the need for semiconductor lasers as light sources for, for example, optical recording and optical communication has increased. Among the semiconductor lasers, vertical cavity surface emitting lasers (VCSELs) have features such as low threshold current, circular beam spots that ease direct coupling to optical fibers, and the capability of on wafer testing. Therefore, the VCSELs are expected as low-cost light emitting devices with low power consumption. In addition, the VCSELs include small-size resonators so that modulation is allowed to be performed at high speed. In view of this, the VCSELs are light sources advantageous to high-speed optical communication.

Figure 10:
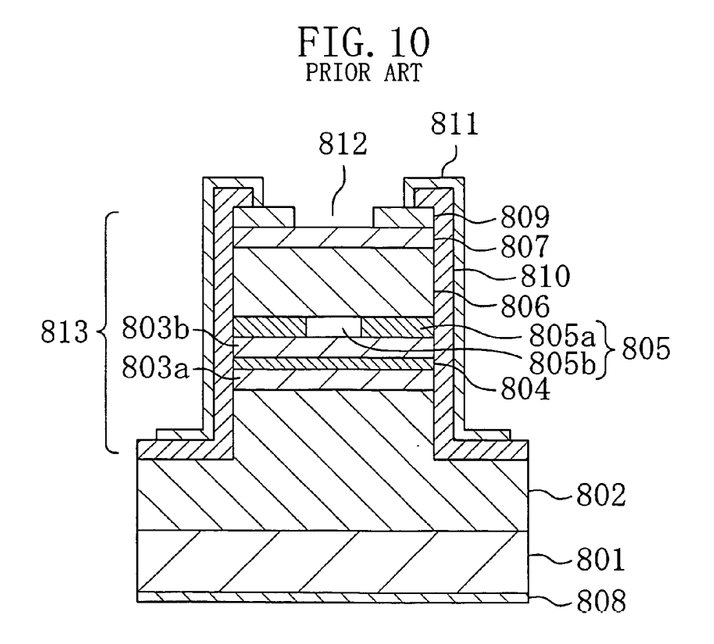
FIG. 10 is a cross-sectional view illustrating a conventional VCSEL.

Hereinafter, as an example of a conventional VCSEL, a structure disclosed in Japanese Unexamined Patent Publication No. 2003-188471 will be described with reference to FIG. 10. FIG. 10 is a cross-sectional view illustrating a structure of the conventional VCSEL.

As illustrated in FIG. 10, in the conventional VCSEL, an n-type mirror 802 composed of $Al_{0.3}Ga_{0.7}As/Al_{0.9}Ga_{0.1}As$ laminated by 40.5 cycles (40.5 pairs) is formed on an n-type semiconductor substrate 801 of GaAs. On the n-type mirror 802, an undoped spacer layer 803a composed of $Al_{0.6}Ga_{0.4}As$, an active layer 804 composed of triple quantum wells of $Al_{0.11}Ga_{0.89}As/Al_{0.3}Ga_{0.7}As$, an undoped spacer layer 803b composed of $Al_{0.6}Ga_{0.4}As$, a p-type AlAs layer 805, a p-type mirror 806 composed of $Al_{0.3}Ga_{0.7}As/Al_{0.9}Ga_{0.1}As$ laminated by 30.5 cycles and a p-type GaAs layer 807 are laminated in this order. The n-type mirror 802 is doped with Si in a concentration of Na (acceptor concentration)=$1\times10^{18}$ cm$^{-3}$. The p-type mirror 806 is doped with Zn in a concentration of Na=$7\times10^{17}$ cm$^{-3}$. The p-type GaAs layer 807 is doped with Zn in a concentration of Na=$1\times10^{19}$ cm$^{-3}$.

The p-type AlAs layer 805 is composed of an oxided region 805a and an unoxided region 805b sandwiched by the oxided region 805a and has a function of confining current in the unoxidized region 805b. An upper portion of the n-type mirror 802 and its overlying layers are processed into a post structure 813. A contact electrode 809 having an aperture 812 for laser emission is formed on the p-type GaAs layer 807. An interlayer insulating film 810 composed of $SiN_x$ is formed to cover the outer periphery of the contact electrode 809, the side face of the post structure 813 and the exposed surface of the n-type mirror 802. A wiring electrode 811 is formed on the interlayer insulating film 810 and also covers a portion of the interlayer insulating film 810 in contact with the outer periphery of the contact electrode 809 such that the wiring electrode 811 is in contact with the contact electrode 809. On the other hand, an n-side electrode 808 is formed on the lower surface of the semiconductor substrate 801.

When a bias voltage is applied between the n-side electrode 808 and the wiring electrode 811 in the conventional VCSEL having the foregoing structure, current is confined in the unoxided region 805b of the p-type AlAs layer 805, so that carriers are injected into the active layer 804. As a result, light emitted from the active layer 804 oscillates in a resonator composed of the n-type mirror 802 and the p-type mirror 806 to be emitted from the aperture 812 to outside the device.

SUMMARY OF THE INVENTION

In a VCSEL having a conventional structure as described above, temperature characteristics of the semiconductor laser is not always sufficient in an application under environments in which operation at high temperature is required, such as an automobile application. When the ambient temperature is high, high-energy electrons increases, resulting in that a large portion of the injected electrons overflows into the spacer layer across the potential barrier.

When the carrier overflow occurs, the refractive index of the spacer layer varies and the resonant wavelength largely deviates from a designed value, thus deteriorating characteristics of the VCSEL. Specifically, the resonant wavelength in the VCSEL is determined by the optical thickness of the resonator, i.e., the sum of the products of the refractive indexes and the thicknesses of respective layers forming the resonator. Accordingly, when the refractive index of the spacer layer varies, the resonant wavelength of the VCSEL also varies. On the other hand, the VCSEL is designed such that the refractive index and the thickness of the spacer layer are determined according to a wavelength at which the gain of the active layer is at the maximum. Accordingly, when the resonant wavelength of the VCSEL varies due to a variation of the refractive index of the spacer layer, deviation from the wavelength at which the gain of the active layer is at the maximum occurs and the gain at the resonant wavelength decreases, thus causing a decrease of the light emission efficiency and other problems. That is, under high-temperature environments, light output is saturated even when driving current is increased, so that sufficient light output is not obtained. In addition, the decrease of the light emission efficiency causes an increase of heat generation in the VCSEL, thus further varying the refractive index. The increase of heat generation leads to a decrease of the gain of the active layer. In this manner, characteristic of the VCSEL deteriorate.

In view of this, it is especially important to suppress overflow of carriers in a VCSEL.

It is therefore an object of the present invention to provide a semiconductor laser device in which overflow of carriers is suppressed and excellent temperature characteristics are exhibited.

To achieve the object, in an aspect of the present invention, a semiconductor laser device has the following structure. That is, an AlGaInP layer having a composition with which the AlGaInP layer serves as a barrier layer against electrons injected into an active layer is provided above or below the active layer. With this configuration, overflow of carriers from the active layer is suppressed, thus obtaining a semiconductor laser device exhibiting excellent temperature characteristics.

Specifically, in an aspect of the present invention, a semiconductor laser device is characterized by including: an active layer formed on a substrate and including an AlGaAs layer; and an $Al_aGa_bIn_{1-a-b}P$ (where $0 \leq a \leq 1$, $0 \leq b \leq 1$ and $0 \leq a+b \leq 1$) layer formed at least one of above and below the active layer, wherein the $Al_aGa_bIn_{1-a-b}P$ layer has a composition enough to serve as a barrier layer against electrons injected into the active layer. With this configuration, overflow of electrons from the active layer is suppressed, thus allowing a semiconductor laser device exhibiting excellent temperature characteristics to be implemented.

In the semiconductor laser device, it is preferable that the substrate is of a first conductivity type, the semiconductor laser device further includes: a first reflector of a second conductivity type formed above the active layer; and a second reflector of the first conductivity type formed below the active layer, and the $Al_aGa_bIn_{1-a-b}P$ layer is located at at least one of a position between the first reflector and the active layer and a position between the second reflector and the active layer. Then, a VCSEL exhibiting excellent temperature characteristics is allowed to be implemented.

In this case, it is more preferable that the semiconductor laser device further includes: a first spacer layer formed between the first reflector and the active layer; and a second spacer layer formed between the second reflector and the active layer, and each of the first spacer layer and the second spacer layer has a thickness enough to obtain a desired laser oscillation wavelength. With this configuration, a VCSEL having a desired oscillation wavelength is allowed to be implemented. Specifically, as described above, overflow of electrons from the active layer to the spacer layer is suppressed, so that variation of the refractive index of the spacer layer is suppressed and the resonant wavelength of the VCSEL does not vary. Accordingly, with this structure, no deviation occurs from a wavelength at which the gain of the active layer is at the maximum and the gain at the resonant wavelength does not decrease, so that a sufficient light-emission efficiency is obtained even under high-temperature environment. In addition, increase of heat generation of the VCSEL caused by a decrease of the light-emission efficiency is suppressed and the decrease of the gain of the active layer is prevented, thus enhancing characteristics of the VCSEL.

In this case, the $Al_aGa_bIn_{1-a-b}P$ layer more preferably forms part of at least one of the first spacer layer and the second spacer layer. Then, overflow of electrons is effectively suppressed. In a structure in which $Al_aGa_bIn_{1-a-b}P$ layers are formed as respective parts of the first and second spacer layers, if the $Al_aGa_bIn_{1-a-b}P$ layers are disposed to be symmetric at positions where light intensity is high, the light-emission characteristic is enhanced.

In another aspect, it is more preferable that at least part of the first reflector is an AlGaAs layer, and the $Al_aGa_bIn_{1-a-b}P$ layer has an aluminum content a greater than 0.15. Then, crystal defects in the AlGaAs layer are reduced.

In another aspect, it is more preferable that at least part of the first reflector is an AlGaAs layer, and a buffer layer including an $Al_cGa_dIn_{1-c-d}P$ (where $0 \leq c \leq 1$, $0 \leq d \leq 1$ and $0 \leq c+d \leq 1$) layer is further provided between the $Al_aGa_bIn_{1-a-b}P$ layer and the AlGaAs layer. Then, crystal defects in the AlGaAs layer are reduced with overflow of carriers effectively suppressed.

In another aspect of the present invention, the semiconductor laser device is characterized in that the $Al_aGa_bIn_{1-a-b}P$ layer has an indium content a of 0.49 or less. Then, the lattice constant of the AlGaInP layer is smaller than that of GaAs and distortion of the layers composed of AlGaAs whose lattice constant is larger than that of GaAs is compensated, so that crystal distortion included in the entire semiconductor laser device is reduced.

In another aspect of the present invention, the semiconductor laser device is characterized in that the $Al_aGa_bIn_{1-a-b}P$ layer is doped with Mg. Then, p-type conduction is formed in the AlGaInP layer, thus reducing the series resistance of the semiconductor laser device.

In another aspect of the present invention, the semiconductor laser device is characterized in that the $Al_aGa_bIn_{1-a-b}P$ layer is doped with one of Si and Se. Then, n-type conduction is formed in the AlGaInP layer, thus reducing the series resistance of the semiconductor laser device.

In another aspect of the present invention, the semiconductor laser device is characterized in that the $Al_aGa_bIn_{1-a-b}P$ layer has a doping concentration in the range from $1 \times 10^{17}$ cm$^{-3}$ to $2 \times 10^{18}$ cm$^{-3}$, both inclusive. Then, the AlGaInP layer has a low resistance with diffusion of the dopant into the active layer prevented.

In another aspect of the present invention, it is more preferable that each of the first spacer layer and the second spacer layer includes at least two layers, one of the layers in each of the first spacer layer and the second spacer layer toward the active layer is an AlGaAs layer, and the other layer in each of the first spacer layer and the second spacer layer is the $Al_aGa_bIn_{1-a-b}P$ layer. Then, the distance from a heterointerface between AlGaAs and AlGaInP to the active layer is large. Since the composition of Group-V materials greatly differ from each other at the heterointerface between AlGaAs and AlGaInP, interdiffusion of constituent elements is likely to be formed. This causes a reduction of the light-emission efficiency in the active layer. However, the large distance from the heterointerface to the active layer enables suppression of harmful effects on the active layer due to such interdiffusion.

In another aspect of the present invention, it is more preferable that a mesa structure including at least a portion of the first reflector, the first spacer layer, the active layer, the second spacer layer and the second reflector is formed.

In another aspect of the present invention, it is more preferable that at least part of the first reflector is an AlGaAs layer, a mesa structure including at least one layer overlying the $Al_aGa_bIn_{1-a-b}P$ layer is formed, and the surface of the $Al_aGa_bIn_{1-a-b}P$ layer is exposed near the periphery of the bottom of the mesa structure. Then, in the dry etching for forming the mesa structure, AlGaAs and AlGaInP are allowed to be selectively etched, thus obtaining a semiconductor laser device exhibiting excellent surface flatness.

In this case, the mesa structure includes one of a region which serves as a current confinement region and is selectively oxidized and a region which serves as a current confinement region and in which protons are implanted. Then, a semiconductor laser device in which current is allowed to effectively flow into a desired portion is implemented.

The semiconductor laser device preferably further includes: a first protective layer in contact with a side face of the mesa structure; a resin film in contact with the first protective layer; a second protective layer formed on the resin film and being in contact with the resin film; and an electrode covering part of an upper portion of the mesa structure and having an opening in which part of the surface of the mesa structure is exposed. Then, it is possible to implement a highly reliable semiconductor laser device in which the surface is planarized and disconnection of electrodes is not likely to occur.

As described above, according to the present invention, an AlGaInP layer with a composition with which the layer serves as a barrier layer against electrons injected to an active layer is formed at least one of above and below the active layer. This ensures suppression of overflow of electrons injected into the active layer and a high light-emission recombination efficiency is obtained in the active layer. Accordingly, a semiconductor laser device having low threshold current and excellent temperature characteristics is implemented.

In addition, as described above, overflow of electrons from the active layer to the spacer layer is suppressed, so that variation of the refractive index of the spacer layer is suppressed and the resonant wavelength of the VCSEL does not vary. Accordingly, no deviation occurs from a wavelength at which the gain of the active layer is at the maximum and the gain at the resonant wavelength does not decrease, so that a sufficient light-emission efficiency is obtained even under high-temperature environments. In addition, increase of heat generation of the VCSEL caused by a decrease of the light-emission efficiency is suppressed and a decrease of the gain of the active layer is prevented, thus enhancing characteristics of the VCSEL.

Moreover, according to the present invention, a buffer layer composed of an AlGaInP layer having a small Ga content is formed on the AlGaInP layer, so that generation of crystal defects in forming a reflector of AlGaAs is suppressed, and a highly reliable semiconductor laser device is obtained. The AlGaInP layer serves as an etching stopper in a dry etching process for forming a mesa structure, so that a uniform etching depth is obtained. As a result, a semiconductor laser device exhibiting excellent surface flatness is obtained.

DETAILED DESCRIPTION OF THE INVENTION

Hereinafter, semiconductor laser devices according to embodiments of the present invention will be described with reference to the drawings. Components common to the drawings are denoted by the same reference numerals.

Embodiment 1

Figure 1:
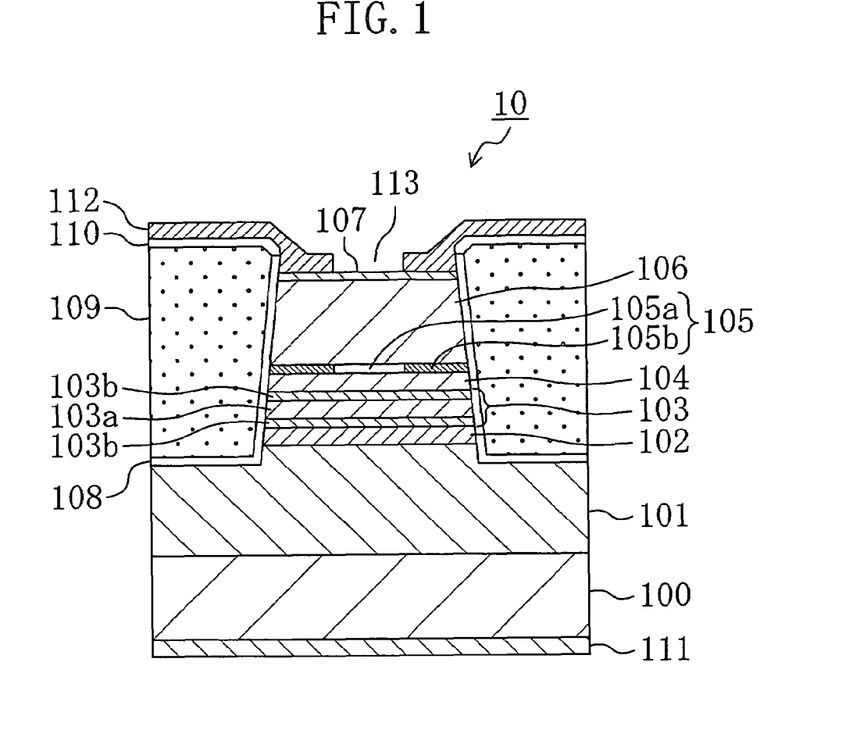
FIG. 1 is a cross-sectional view illustrating a semiconductor laser device according to a first embodiment of the present invention.

FIG. 1 is a cross-sectional view illustrating a semiconductor laser device according to a first embodiment of the present invention.

As illustrated in FIG. 1, in a semiconductor laser device 10 according to the first embodiment, an n-type lower multilayer reflector 101, a lower spacer layer 102, an active layer 103, an upper spacer layer 104, a current confinement layer 105, a p-type upper multilayer reflector 106 and a p-type contact layer 107 are laminated in this order on a substrate 100 of n-type GaAs.

The n-type lower multilayer reflector 101 is a multilayer film formed by alternately stacking n-type $Al_{0.12}Ga_{0.88}As$ layers and n-type $Al_{0.90}Ga_{0.10}As$ layers. The thickness of each layer is $\lambda/4n$ ($\lambda$: a laser oscillation wavelength, n: a refractive index of a medium) and the n-type $Al_{0.12}Ga_{0.88}As$ layers and the n-type $Al_{0.90}Ga_{0.10}As$ layers are laminated by 34.5 cycles (34.5 pairs). Each of the top and bottom layers of the n-type lower multilayer reflector 101 is an n-type $Al_{0.90}Ga_{0.10}As$ layer. The lower spacer layer 102 is composed of $Al_{0.45}Ga_{0.55}As$.

The active layer 103 is composed of a quantum well layer 103a and optical guide layers 103b. The optical guide layers 103b vertically sandwich the quantum well layer 103a and are made of $Al_{0.30}Ga_{0.70}As$. The quantum well layer 103a is formed by alternately stacking well layers of GaAs and barrier layers of $Al_{0.30}Ga_{0.70}As$. The number of the well layers is three. The upper spacer layer 104 is composed of $(Al_{0.70}Ga_{0.30})_{0.51}In_{0.49}P$.

The current confinement layer 105 is composed of a current confinement layer 105a of p-type $Al_{0.98}Ga_{0.02}As$ and an AlGaAs oxide layer 105b of aluminum oxide formed at the periphery of the current confinement layer 105a. This structure limits a current path to the AlGaAs current confinement layer 105a. The current confinement layer 105 serves as a part of the upper multilayer reflector.

The p-type upper multilayer reflector 106 is a multilayer film formed by alternately stacking p-type $Al_{0.12}Ga_{0.88}As$ layers and p-type $Al_{0.90}Ga_{0.10}As$ layers. The thickness of each layer is $\lambda/4n$ ($\lambda$: a laser oscillation wavelength, n: a refractive index of a medium) and p-type $Al_{0.12}Ga_{0.88}As$ layers and p-type $Al_{0.90}Ga_{0.10}As$ layers are laminated by 22 cycles (22 pairs). The bottom layer of the p-type upper multilayer reflector 106 is a p-type $Al_{0.12}Ga_{0.88}As$ layer and the top layer thereof is a p-type $Al_{0.90}Ga_{0.10}As$ layer. The p-type contact layer 107 is composed of a p-type GaAs layer.

The refractive indexes, the thicknesses and the optical thicknesses, each of which is determined by the product of the refractive index and the thickness, in the lower spacer layer 102, the active layer 103 and the upper spacer layer 104, respectively, are shown in Table 1 as follows:

TABLE 1

| Layer | | Material | Al Content x | Refractive Index | Thickness (nm) | Optical Thickness (nm) |
|---|---|---|---|---|---|---|
| Upper Spacer Layer 104 | | $(Al_xGa_{1-x})_{0.51}In_{0.49}P$ | 0.70 | 3.15 | 92 | 291 |
| Optical Guide Layer 103b | | $Al_xGa_{1-x}As$ | 0.30 | 3.43 | 20 | 69 |
| Quantum Well Layer 103a | Well Layer | $Al_xGa_{1-x}As$ | 0.00 | 3.65 | 7 | 26 |
| | Barrier Layer | $Al_xGa_{1-x}As$ | 0.30 | 3.43 | 8 | 27 |
| | Well Layer | $Al_xGa_{1-x}As$ | 0.00 | 3.65 | 7 | 26 |
| | Barrier Layer | $Al_xGa_{1-x}As$ | 0.30 | 3.43 | 8 | 27 |
| | Well Layer | $Al_xGa_{1-x}As$ | 0.00 | 3.65 | 7 | 26 |

TABLE 1-continued

| Layer | Material | Al Content x | Refractive Index | Thickness (nm) | Optical Thickness (nm) |
|---|---|---|---|---|---|
| Optical Guide Layer 103b | $Al_xGa_{1-x}As$ | 0.30 | 3.43 | 20 | 69 |
| Lower Spacer Layer 102 | $Al_xGa_{1-x}As$ | 0.45 | 3.32 | 87 | 291 |
| | | | | Total | 850 |

As shown in Table 1, the thickness of the spacer layer is adjusted such that the sum of the optical thicknesses is 850 nm, which is a desired laser oscillation wavelength. A laser resonator having a cavity length corresponding to one wavelength is formed between the n-type lower multilayer reflector 101 and the p-type upper multilayer reflector 106. In the structure of a reflector as in this embodiment, energy distribution of a standing wave occurring in the resonator is at the maximum at the center of the resonator. Accordingly, to dispose the active layer at this position, the lower spacer layer 102 and the upper spacer layer 104 are formed to have an equal optical thickness.

As illustrated in FIG. 1, a mesa structure is composed of a portion of the n-type lower multilayer reflector 101, the lower spacer layer 102, the active layer 103, the upper spacer layer 104, the current confinement layer 105, the p-type upper multilayer reflector 106 and the p-type contact layer 107. On the side faces of the mesa structure and part of the surface of the n-type lower multilayer reflector 101 at the periphery of the mesa structure, a first protective layer 108 of $SiO_2$ and a resin film 109 of BCB are formed in this order. The surface of the semiconductor laser device is planarized with the resin film 109. A second protective layer 110 of $SiO_2$ is formed on the resin film 109. A p-side electrode 112 having a light emission window 113 is formed on the p-type contact layer 107 and the second protective layer 110. On the other hand, an n-side electrode 111 is formed on the lower surface of the substrate 100.

The n-type lower multilayer reflector 101 is doped with silicon as an n-type impurity in a concentration on the order of $10^{18}$ cm$^{-3}$. The AlGaAs current confinement layer 105a and the p-type upper multilayer reflector 106 are doped with carbon as a p-type impurity in a concentration on the order of $10^{18}$ cm$^{-3}$. The p-type contact layer 107 is doped with carbon in a high concentration of $10^{19}$ cm$^{31\ 3}$ or more so as to reduce a contact resistance with the p-side electrode 112.

Hereinafter, operation of the semiconductor laser device of the present invention will be described.

When a voltage is applied between the p-side electrode 112 and the n-side electrode 111, holes injected from the p-side electrode 112 pass through the AlGaAs current confinement layer 105a in the current confinement layer 105 to reach the active layer 103 and recombine with electrons injected from the n-side electrode 111 in the active layer 103, thereby emitting light. When the injected current exceeds the threshold current, the resonator formed by the n-type lower multilayer reflector 101 and the p-type upper multilayer reflector 106 causes laser oscillation so that laser light is emitted from the light emission window 113 that is an aperture in the p-side electrode 112.

Figure 2:
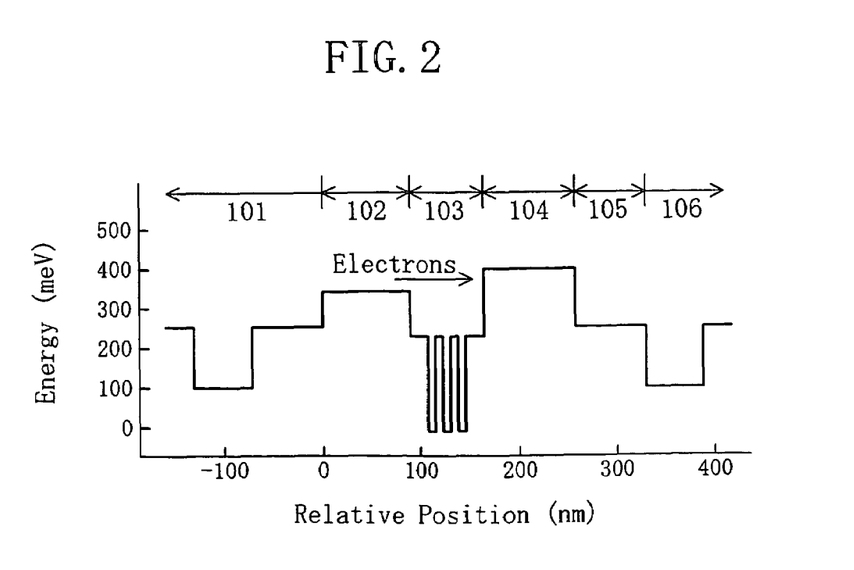
FIG. 2 is a graph showing a conduction-band lineup around an active layer of the semiconductor laser device of the first embodiment.

FIG. 2 shows a conduction-band lineup around the active layer 103 in the semiconductor laser device of the first embodiment.

As shown in FIG. 2, this embodiment is characterized in that the upper spacer layer 104 is composed of AlGaInP having a composition with which the upper spacer layer 104 serves as a barrier against electrons and a band discontinuity amount ΔEc between the active layer 103 and the upper spacer layer 104 is large. Specifically, if the upper spacer layer 104 is composed of a conventional $Al_xGa_{1-x}As$-based material, ΔEc between GaAs of the quantum well layer 103a and the upper spacer layer 104 has a maximum value of 350 meV at an Al content x of 0.43. On the other hand, if the upper spacer layer 104 is composed of an $(Al_xGa_{1-x})_{0.51}In_{0.49}P$-based material, ΔEc between GaAs of the quantum well layer 103a and the upper spacer layer 104 has a maximum value of 400 meV at an Al content x of 0.70.

As described above, in the semiconductor laser device of the first embodiment, a heterobarrier against electrons injected into the active layer 103 from the lower spacer layer 102 is large, thus ensuring suppression of overflow of electrons toward the upper spacer layer 104 and obtaining a high light-emission recombination efficiency in the active layer 103. Accordingly, in the semiconductor laser device of the first embodiment, the threshold current is low and excellent temperature characteristics are exhibited.

In the semiconductor laser device of the first embodiment, since the heterobarrier against electrons injected from the lower spacer layer 102 into the active layer 103 is large, suppression of overflow of electrons toward the upper spacer layer 104 is ensured, thus reducing variation of the refractive index of the upper spacer layer 104. Accordingly, the resonant wavelength of the resonator formed by the n-type lower multilayer reflector 101 and the p-type upper multilayer reflector 106 less deviates from the designed value, thus enhancing the yield in manufacturing semiconductor laser devices. The variation of the refractive index of the spacer layer 104 is reduced because of the following reasons. One reason is that heat generation of the semiconductor laser device is reduced by suppressing overflow of carriers so that the temperature variation in the spacer layer 104 decreases. Another reason is that diffusion of carriers into the spacer layer 104 is suppressed so that a variation of the refractive index (plasma effect) caused by carriers in the spacer layer 104 is suppressed.

Figure 3:
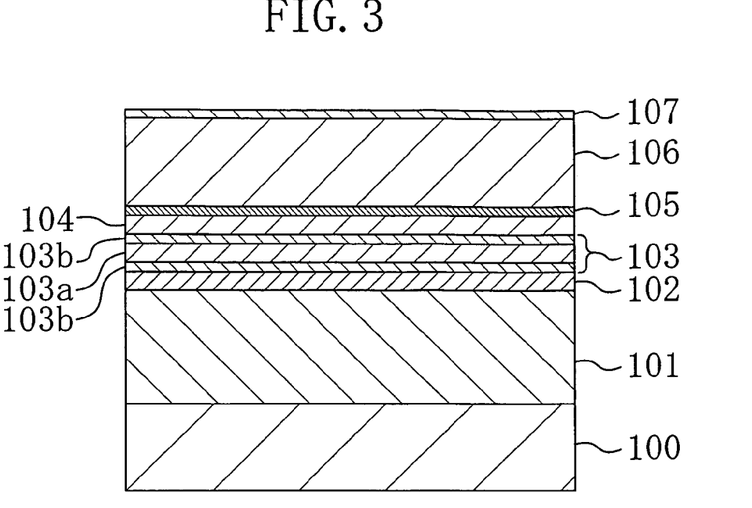
FIG. 3 is a cross-sectional view showing a method for fabricating a semiconductor laser device according to the first embodiment.
Figure 4:
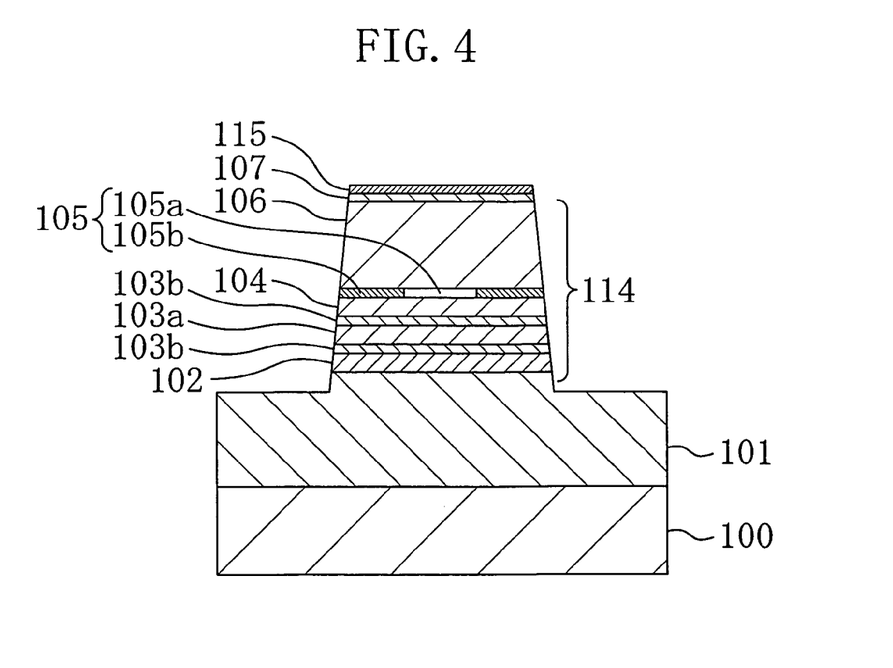
FIG. 4 is a cross-sectional view showing the method for fabricating a semiconductor laser device according to the first embodiment.
Figure 5:
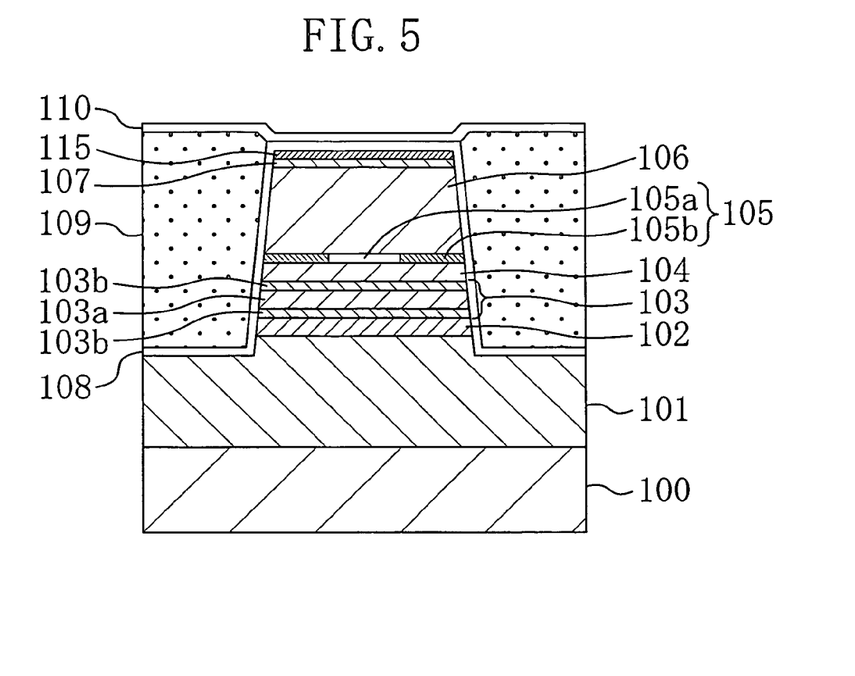
FIG. 5 is a cross-sectional view showing the method for fabricating a semiconductor laser device according to the first embodiment.

Hereinafter, a method for fabricating a semiconductor laser device according to the first embodiment will be described with reference to FIGS. 3 through 5. FIGS. 3 through 5 are cross-sectional views showing respective process steps of the method for fabricating a semiconductor laser device of the first embodiment.

First, as illustrated in FIG. 3, an n-type lower multilayer reflector 101, a lower spacer layer 102, an active layer 103, an upper spacer layer 104, a current confinement layer 105, a p-type upper multilayer reflector 106 and a p-type contact layer 107 are formed in this order over a substrate 100 using a crystal growth technique such as metal organic chemical vapor deposition or molecular beam epitaxy.

Next, a $SiO_2$ film (not shown) is formed by CVD or sputtering over the entire surface of the substrate 100, and then is processed into a desired pattern by photolithography and dry etching. Subsequently, dry etching is performed using a processed $SiO_2$ film 115 as a mask, thereby partially removing the p-type contact layer 107, the p-type upper multilayer reflector 106, the current confinement layer 105, the upper spacer layer 104, the active layer 103, the lower spacer layer 102 and the n-type lower multilayer reflector 101. This removal is stopped in the n-type lower multilayer reflector 101. In this manner, a mesa structure 114 shown in FIG. 4 is formed.

Thereafter, the mesa structure 114 is exposed to a water vapor atmosphere at 400° C. for about 15 minutes, thereby oxidizing the mesa structure 114 from the outer periphery thereof. The rate of this oxidation varies depending on the Al contents of the respective layers forming the mesa structure 114 and increases as the Al contents increase. In this case, since the Al content in the current confinement layer 105 is large, the current confinement layer 105 is oxidized faster than the other layers in the mesa structure 114 and an AlGaAs oxide layer 105b is formed in a portion of the current confinement layer 105 around the outer edge thereof as illustrated in FIG. 4. Accordingly, a region surrounded by the AlGaAs oxide layer 105b serves as an AlGaAs current confinement layer 105a.

Subsequently, as illustrated in FIG. 5, a first protective layer 108 of $SiO_2$ is formed over the surface of the mesa structure 114, the side face of the mesa structure 114 and the exposed surface of the n-type lower multilayer reflector 101. Thereafter, a resin film 109 of BCB are applied onto the first protective layer 108, and then part of the resin film 109 located on the mesa structure 114 is exposed to light and development and is selectively etched by dry etching, thereby exposing part of the first protective layer 108 located on the mesa structure 114. Subsequently, a second protective layer 110 of $SiO_2$ is formed to cover the entire surface of the substrate 100.

Then, a mask is formed using a photoresist in an aperture formed by removing the second protective layer 110, the first protective layer 108 and the $SiO_2$ film 115 on the mesa structure 114 through wet etching. Thereafter, a metal film (e.g., Ti/Pt/Au) is formed over the entire surface to be in Ohmic contact with the p-type contact layer 107. Subsequently, the photoresist and the metal formed thereon are removed by lift-off, thereby forming a p-side electrode 112 having an opening to be a light emission window 113.

Lastly, a metal film (e.g., an alloy composed of Au, Ge or Ni) is formed through polishing and etching on the lower surface of the substrate 100 adjusted to have an arbitrary thickness and is brought into an Ohmic contact with the substrate 100. Then, heat treatment is performed at about 400° C. in a nitrogen atmosphere for 10 minutes, thereby forming alloys between the n-side electrode 111 and the substrate 100 and between the p-side electrode 112 and the p-type contact layer 107.

With the foregoing fabricating method, a semiconductor laser device of the first embodiment illustrated in FIG. 1 is fabricated.

In this embodiment, only the upper spacer layer 104 is composed of $(Al_{0.70}Ga_{0.30})_{0.51}In_{0.49}P$. However, the present invention is not limited to this embodiment. The lower spacer layer 102 may also be composed of $(Al_{0.70}Ga_{0.30})_{0.51}In_{0.49}P$. In such a case, a heterobarrier of the valence band between the lower spacer layer 102 and the active layer 103 is allowed to be high. This ensures suppression of overflow of holes injected into the active layer into the lower spacer layer 102. Accordingly, a high light-emission recombination efficiency is obtained in the active layer 103, thus implementing a semiconductor laser device having low threshold current and exhibiting excellent temperature characteristics.

In this embodiment, the upper spacer layer 104 is composed of AlGaInP, which is less likely to be oxidized than AlGaAs. In this case, an advantage in which the upper spacer layer 104 is not readily oxidized in the process step of forming the AlGaAs oxide layer 105b is obtained.

In addition, in this embodiment, the upper spacer layer 104 is composed of $(Al_xGa_{1-x})_{0.51}In_{0.49}P$. Alternatively, the composition thereof may be set such that the sum of the Al content and the Ga content is larger than 0.51 and the In content is smaller than 0.49. In such a case, the following advantages are obtained. That is, in this embodiment, AlGaAs, which is a material forming the layers except for the upper spacer layer 104, is substantially in lattice match with GaAs but has a lattice constant slightly greater than that of GaAs, and the difference in lattice constant between AlGaAs and GaAs increases as the Al content in AlGaAs increases. In particular, in a VCSEL, layers having large Al contents are laminated to form a reflector, so that crystal strain caused by the lattice constant difference becomes nonnegligible to cause deterioration of crystal quality or device characteristics. On the other hand, in this embodiment, AlGaInP is used as the upper spacer layer so that the In content is smaller than 0.49. Accordingly, the lattice constant of AlGaInP is smaller than that of GaAs. This compensates strain of the layers composed of AlGaAs, so that crystal strain included in the entire semiconductor laser device 10 is reduced.

In this embodiment, the upper spacer layer 104 is undoped. However, the present invention is not limited to this embodiment, and the upper spacer layer 104 may be p-doped. If the upper spacer layer 104 is p-doped, the series resistance of the semiconductor laser device 10 is reduced. In this case, use of Mg or Zn as a dopant for an AlGaInP material forming the upper spacer layer 104 allows p-type conduction to be obtained. Since the spacer layer 104 is adjacent to the active layer 103, Mg, which is not readily diffused, is preferably used as a dopant. As a doping concentration, the range from $1 \times 10^{17}$ cm$^{-3}$ to $2 \times 10^{18}$ cm$^{-3}$, both inclusive, within which resistance can be reduced without diffusion to the active layer 103 is preferable.

In this embodiment, the entire upper spacer layer 104 is composed of AlGaInP. However, the present invention is not limited to this embodiment, and a portion of the upper spacer layer 104 may be composed of AlGaInP with the other portion thereof composed of AlGaAs. Since the P content and the As content greatly differ from each other near the heterointerface between AlGaInP and AlGaAs, regions where interdiffusion of P and As occurs is likely to be formed, so that the emission efficiency in the active layer 103 decreases. On the other hand, if a portion of the upper spacer layer 104 near the active layer 103 is composed of AlGaAs, the distance from the interface between AlGaAs and AlGaInP to the active layer 103 is large, so that the decrease of the emission efficiency in the active layer 103 is suppressed.

Figure 6:
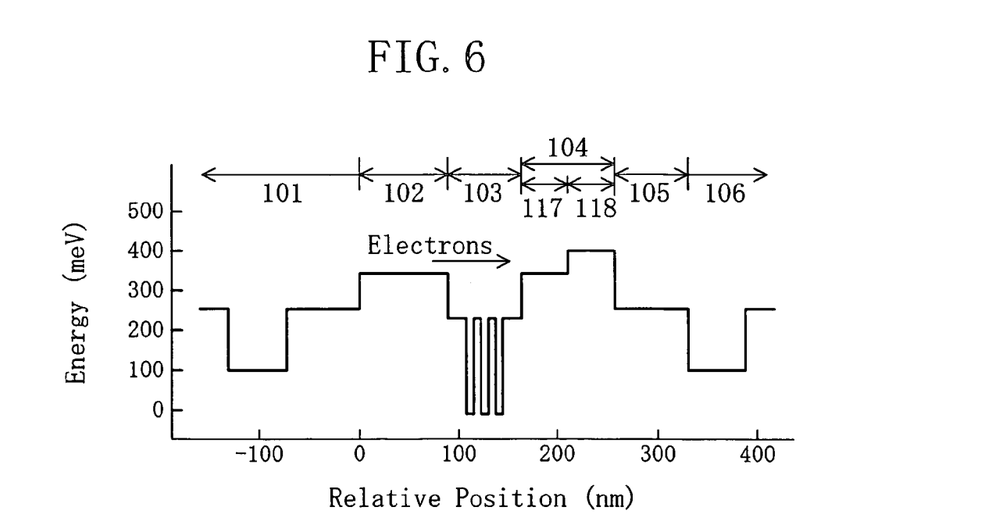
FIG. 6 is a graph showing a conduction-band lineup around an active layer of a semiconductor laser device according to a modified example of the first embodiment.

FIG. 6 shows a conduction-band lineup in a case where a portion of the upper spacer layer 104 near the active layer 103 is composed of AlGaAs. In this case, the upper spacer layer 104 includes: an AlGaAs layer 117 having a thickness of 40 nm and formed near the active layer 103; and an AlGaInP layer 118 having a thickness of 50 nm and formed near the current confinement layer 105. The thickness of each of the AlGaAs layer 117 and the AlGaInP layer 118 is set such that the total optical thickness of the upper spacer layer 104 is equal to the optical thickness of the lower spacer layer 102.

As is clear from FIG. 6, the AlGaInP layer 118 of the upper spacer layer 104 toward the active layer 103 serves as a barrier layer to suppress overflow of electrons from the active layer 103.

Embodiment 2

Hereinafter, a semiconductor laser device according to a second embodiment of the present invention will be described with reference to the drawings. Part of the cross-sectional structure of the semiconductor laser device of this embodiment common to that of the first embodiment has been already described in the first embodiment. In this embodiment, only part of the semiconductor laser device of the second embodiment different from that of the first embodiment will be described.

Figure 7:
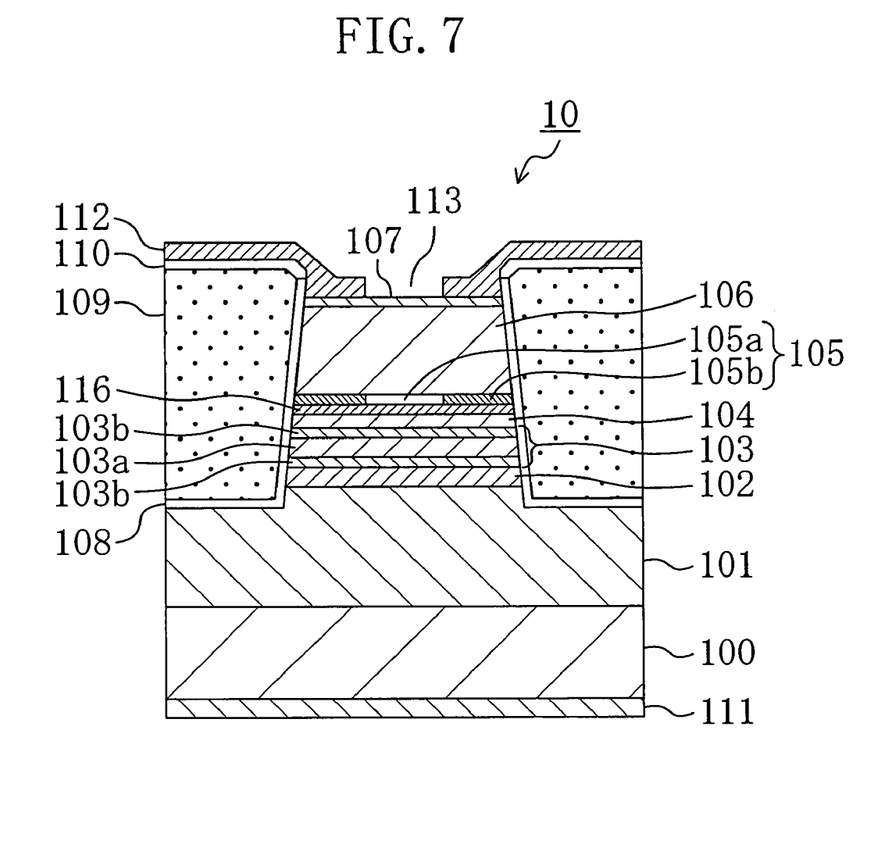
FIG. 7 is a cross-sectional view illustrating a semiconductor laser device according to a second embodiment of the present invention.

FIG. 7 is a cross-sectional view illustrating the semiconductor laser device of the second embodiment.

As illustrated in FIG. 7, the semiconductor laser device of this embodiment is different from that of the first embodiment in that a buffer layer 116 of AlInP is formed between an upper spacer layer 104 of AlGaInP and a current confinement layer 105.

In crystal growth of an AlGaAs layer on an AlGaInP layer containing a different Group-V element, the Ga content of the AlGaInP layer is small so that the AlGaAs layer includes a small number of crystal defects. This is because interaction between the GaP component in the AlGaInP layer and the AlAs component in the AlGaAs layer becomes small to facilitate migration of the AlAs component in the formation of the AlGaAs layer.

Figure 8:
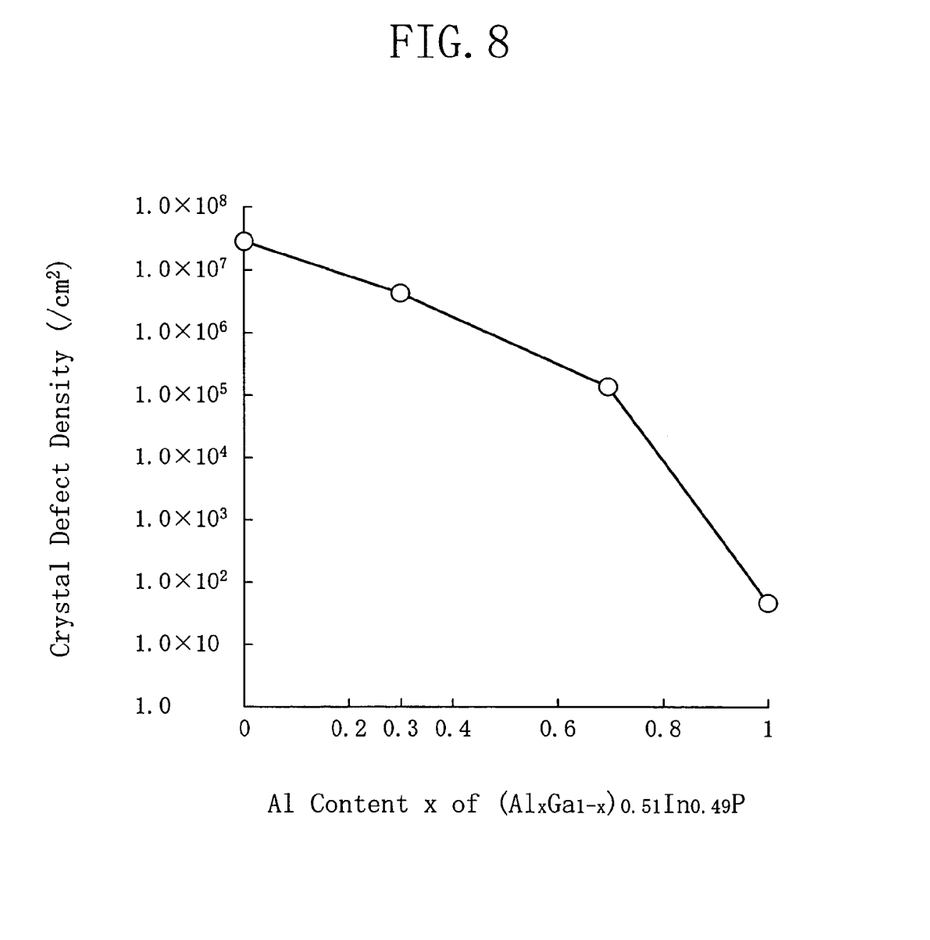
FIG. 8 is a graph showing dependence of a crystal defect density on an Al content x in a structure in which an $Al_{0.6}Ga_{0.4}As$ layer is formed on an $(Al_xGa_{1-x})_{0.51}In_{0.49}P$ layer.

FIG. 8 shows dependence of a crystal defect density on an Al content x in a structure in which an $Al_{0.6}Ga_{0.4}As$ layer is formed on an $(Al_xGa_{1-x})_{0.51}In_{0.49}P$ layer.

As shown in FIG. 8, as the Al content x in the $(Al_xGa_{1-x})_{0.51}In_{0.49}P$ layer increases, the crystal defect density decreases. Specifically, in a case where an $Al_{0.6}Ga_{0.4}As$ layer is formed on a $Ga_{0.51}In_{0.49}P$ layer (where x=0), the crystal defect density is about $2.7\times10^7/cm^2$. On the other hand, in a case where the layer is formed on an $(Al_{0.30}Ga_{0.70})_{0.51}In_{0.49}P$ layer (where x=0.30), the crystal defect density is about $4.0\times10^6/cm^2$. In a case where the layer is formed on an $(Al_{0.70}Ga_{0.30})_{0.51}In_{0.49}P$ layer (where x=0.70), the crystal defect density is reduced to about $1\times10^5/cm^2$. In addition, if the $Al_{0.6}Ga_{0.4}As$ layer is formed on an $Al_{0.51}In_{0.49}P$ layer (where x=1), crystal defects are hardly observed and the density thereof is on the order of two digits per square centimeter.

In this embodiment, the buffer layer 116 of AlInP is formed on the upper spacer layer 104 of AlGaInP and the current confinement layer 105 of AlGaAs is formed thereon, thus greatly reducing crystal defects in the current confinement layer 105.

In this embodiment, the case of forming the buffer layer 116 is described. Alternatively, the Ga content of the upper spacer layer 104 may be reduced so that crystal defects in the current confinement layer 105 made of AlGaAs are reduced. As described above, $\Delta Ec$ is at the maximum at x=0.70 in an $(Al_xGa_{1-x})_{0.51}In_{0.49}P$-based material and $\Delta Ec$ disadvantageously decreases at a larger Al content, i.e., at a Ga content of 0.30 or less. Accordingly, if the buffer layer 116 having a small Ga content is formed as in this embodiment, $\Delta Ec$ is allowed to be set at a large value between the active layer 103 and the upper spacer layer 104 and, in addition, crystal defects in the current confinement layer 105 are reduced.

In this manner, the semiconductor laser device of this embodiment achieves reduction of crystal defects, and thus exhibits high reliability.

Embodiment 3

Hereinafter, a semiconductor laser device according to a third embodiment of the present invention will be described with reference to the drawings. Part of the cross-sectional structure of the semiconductor laser device of this embodiment common to that of the first embodiment is already described in the first embodiment. In this embodiment, only a part of the semiconductor laser device of the third embodiment different from that of the first embodiment will be described.

Figure 9:
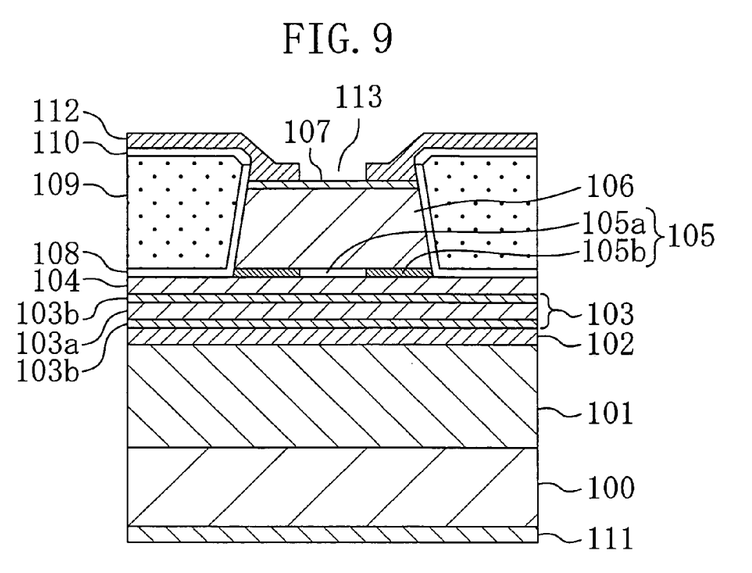
FIG. 9 is a cross-sectional view illustrating a semiconductor laser device according to a third embodiment of the present invention.

FIG. 9 is a cross-sectional view illustrating the semiconductor laser device of the third embodiment.

As illustrated in FIG. 9, the semiconductor laser device of the third embodiment is different from that of the first embodiment in that a mesa structure including a current confinement layer 105, a p-type upper multilayer reflector 106 and a p-type contact layer 107 is formed and a portion of an n-type lower multilayer reflector 101, a lower spacer layer 102, an active layer 103 and an upper spacer layer 104 do not form the mesa structure.

A method for fabricating a semiconductor laser device according to the third embodiment is different from that of the first embodiment in that at the step of forming the mesa structure 114 illustrated in FIG. 4, only the p-type contact layer 107, the p-type upper multilayer reflector 106 and the current confinement layer 105 are partially removed by dry etching and a portion of the n-type lower multilayer reflector 101, the lower spacer layer 102, the active layer 103 and the upper spacer layer 104 are not removed. Specifically, in this embodiment, the p-type contact layer 107 of AlGaAs, the p-type upper multilayer reflector 106 and the current confinement layer 105 are partially removed by etching and the etching is performed until the upper spacer layer 104 of AlGaInP, which is a different Group-V material, is exposed at the surface. In this manner, a mesa structure made up of the current confinement layer 105, the p-type upper multilayer reflector 106 and the p-type contact layer 107 is formed.

In this embodiment, the dry etching rate varies between different Group-V materials even under the same etching conditions. Under some conditions, the etching rate for AlGaInP is lower than that for AlGaAs. Accordingly, if appropriate etching conditions are adopted, etching is allowed to be easily stopped at the upper spacer layer 104. In this case, since the etching selectivity is high, the surface of the upper spacer layer 104 exposed by etching is flat. Accordingly, it is easy to planarize the semiconductor laser device using a resin film 109. In addition, it is also possible to reduce an in-plane variation caused by etching even for a wafer having a large diameter.

This embodiment is applicable to the structure of the second embodiment in which the buffer layer 116 is provided. In this case, a mesa structure may be formed by performing etching until the upper spacer layer 104 is exposed as in this embodiment, or by performing etching until the buffer layer 116 is exposed.

Other Embodiments

In the first through third embodiments, the n-type lower multilayer reflector 101, the p-type upper multilayer reflector 106 and the p-type contact layer 107 are formed in this order over the GaAs substrate 100 that is of the n-type. However, the present invention is not limited to these embodiments. Specifically, a p-type lower multilayer reflector, an n-type upper multilayer reflector and an n-type contact layer may be formed in this order on a GaAs substrate that is of the p-type.

In the foregoing embodiments, BCB is used as a material for the resin film 109. However, the present invention is not limited to this, and SiLK or FLARE (registered trademark) may be used as a resin material.

In the foregoing embodiments, the semiconductor laser device has an oscillation wavelength of about 850 nm. However, the present invention is not limited to these embodiments. That is, the advantages of the embodiments are not limited by the oscillation wavelength, and the same advantages are obtained in a semiconductor laser device of any wavelength. In particular, as the oscillation wavelength decreases, the necessity of increasing the bandgap of the active layer increases. In this case, the amount ΔEc of the band discontinuity with the spacer layer decreases. Accordingly, the advantages of the present invention obtained by setting ΔEc at a large value are more noticeable as the oscillation wavelength decreases.

The semiconductor laser device of the present invention has excellent temperature characteristics and is useful as a light source for, for example, optical recording or optical communication. The semiconductor laser device is especially advantageous under circumstances such as in-car use that requires operation at high temperature.

What is claimed is:

1. A semiconductor laser device, comprising:
   an active layer formed on a substrate of a first conductivity type and including an AlGaAs layer;
   an $Al_aGa_bIn_{1-a-b}P$ (where $0 \leq a \leq 1$, $0 \leq b \leq 1$ and $0 \leq a+b \leq 1$) layer formed at least one of above and below the active layer,
   a first reflector of a second conductivity type formed above the active layer;
   a second reflector of the first conductivity type formed below the active layer;
   a first spacer layer formed between the first reflector and the active layer; and
   a second spacer layer formed between the second reflector and the active layer,
   wherein each of the first spacer layer and the second spacer layer has a thickness enough to obtain a desired laser oscillation wavelength,
   wherein the $Al_aGa_bIn_{1-a-b}P$ layer has a composition enough to serve as a barrier layer against electrons injected into the active layer, and is located at least one of a position between the first reflector and the active layer and a position between the second reflector and the active layer, and forms part of at least one of the first spacer layer and the second spacer layer,
   wherein at least part of the first reflector is an AlGaAs layer, and
   a buffer layer including an $Al_cGa_dIn_{1-c-d}P$ (where $0 \leq c \leq 1$, $0 \leq d \leq 1$ and $0 \leq c+d \leq 1$) layer is further provided between the $Al_aGa_bIn_{1-a-b}P$ layer and the AlGaAs layer.

2. The semiconductor laser device of claim 1, wherein at least part of the first reflector is an AlGaAs layer, and the $Al_aGa_bIn_{1-a-b}P$ layer has an aluminum content greater than 0.15.

3. The semiconductor laser device of claim 1, wherein the $Al_aGa_bIn_{1-a-b}P$ layer has an indium content of 0.49 or less.

4. The semiconductor laser device of claim 1, wherein the $Al_aGa_bIn_{1-a-b}P$ layer is doped with Mg.

5. The semiconductor laser device of claim 1, wherein the $Al_aGa_bIn_{1-a-b}P$ layer is doped with one of Si and Se.

6. The semiconductor laser device of claim 1, wherein the $Al_aGa_bIn_{1-a-b}P$ layer has a doping concentration in the range from $1 \times 10^{17}$ cm$^{-3}$ to $2 \times 10^{18}$ cm$^{-3}$, both inclusive.

7. A semiconductor laser device, comprising:
   an active layer formed on a substrate of a first conductivity type and including an AlGaAs layer;
   an $Al_aGa_bIn_{1-a-b}P$ (where $0 \leq a \leq 1$, $0 \leq b \leq 1$ and $0 \leq a+b \leq 1$) layer formed at least one of above and below the active layer,
   a first reflector of a second conductivity type formed above the active layer;
   a second reflector of the first conductivity type formed below the active layer;
   a first spacer layer formed between the first reflector and the active layer; and
   a second spacer layer formed between the second reflector and the active layer,
   wherein each of the first spacer layer and the second spacer layer has a thickness enough to obtain a desired laser oscillation wavelength,
   wherein the $Al_aGa_bIn_{1-a-b}P$ layer has a composition enough to serve as a barrier layer against electrons injected into the active layer, and is located at least one of a position between the first reflector and the active layer and a position between the second reflector and the active layer, and forms part of at least one of the first spacer layer and the second spacer layer,
   wherein each of the first spacer layer and the second spacer layer includes at least two layers,
   one of the layers in each of the first spacer layer and the second spacer layer toward the active layer is an AlGaAs layer, and
   the other layer in each of the first spacer layer and the second spacer layer is the $Al_aGa_bIn_{1-a-b}P$ layer.

8. A semiconductor laser device, comprising:
   an active layer formed on a substrate of a first conductivity type and including an AlGaAs layer;
   an $Al_aGa_bIn_{1-a-b}P$ (where $0 \leq a \leq 1$, $0 \leq b \leq 1$ and $0 \leq a+b \leq 1$) layer formed at least one of above and below the active layer,
   a first reflector of a second conductivity type formed above the active layer;
   a second reflector of the first conductivity type formed below the active layer;
   a first spacer layer formed between the first reflector and the active layer; and
   a second spacer layer formed between the second reflector and the active layer,
   wherein each of the first spacer layer and the second spacer layer has a thickness enough to obtain a desired laser oscillation wavelength,
   wherein the $Al_aGa_bIn_{1-a-b}P$ layer has a composition enough to serve as a barrier layer against electrons injected into the active layer, and is located at least one of a position between the first reflector and the active layer and a position between the second reflector and the active layer, and forms part of at least one of the first spacer layer and the second spacer layer,
   wherein a mesa structure including at least a portion of the first reflector, the first spacer layer, the active layer, the second spacer layer and the second reflector is formed.

9. The semiconductor laser device of claim 8, wherein the mesa structure includes one of a region which serves as a current confinement region and is selectively oxidized and a region which serves as a current confinement region and in which protons are implanted.

10. A semiconductor laser device, comprising:
   an active layer formed on a substrate of a first conductivity type and including an AlGaAs layer;
   an $Al_aGa_bIn_{1-a-b}P$ (where $0 \leq a \leq 1$, $0 \leq b \leq 1$ and $0 \leq a+b \leq 1$) layer formed at least one of above and below the active layer,
   a first reflector of a second conductivity type formed above the active layer;
   a second reflector of the first conductivity type formed below the active layer;
   a first spacer layer formed between the first reflector and the active layer; and
   a second spacer layer formed between the second reflector and the active layer,
   wherein each of the first spacer layer and the second spacer layer has a thickness enough to obtain a desired laser oscillation wavelength,
   wherein the $Al_aGa_bIn_{1-a-b}P$ layer has a composition enough to serve as a barrier layer against electrons injected into the active layer, and is located at least one of a position between the first reflector and the active layer and a position between the second reflector and the active layer, and forms part of at least one of the first spacer layer and the second spacer layer,
   wherein at least part of the first reflector is an AlGaAs layer,
   a mesa structure including at least one layer overlying the $Al_aGa_bIn_{1-a-b}P$ layer is formed, and
   the surface of the $Al_aGa_bIn_{1-a-b}P$ layer is exposed near the periphery of the bottom of the mesa structure.

11. The semiconductor laser device of claim 10, wherein the mesa structure includes one of a region which serves as a current confinement region and is selectively oxidized and a region which serves as a current confinement region and in which protons are implanted.

12. The semiconductor laser device of claim 8, further comprising:
   a first protective layer in contact with a side face of the mesa structure;
   a resin film in contact with the first protective layer;
   a second protective layer formed on the resin film and being in contact with the resin film; and
   an electrode covering part of an upper portion of the mesa structure and having an opening in which part of the surface of the mesa structure is exposed.

* * * * *